US005465009A

United States Patent [19]
Drabik et al.

[11] Patent Number: 5,465,009
[45] Date of Patent: Nov. 7, 1995

[54] PROCESSES AND APPARATUS FOR LIFT-OFF AND BONDING OF MATERIALS AND DEVICES

[75] Inventors: Timothy J. Drabik; Kevin P. Martin, both of Atlanta, Ga.; John Callahan, Revere, Mass.

[73] Assignee: Georgia Tech Research Corporation, Atlanta, Ga.

[21] Appl. No.: 196,857

[22] Filed: Feb. 15, 1994

Related U.S. Application Data

[63] Continuation-in-part of Ser. No. 865,119, Apr. 8, 1992, Pat. No. 5,286,335.

[51] Int. Cl.$^6$ ............................ H01L 23/16; H01L 39/02
[52] U.S. Cl. ................................ 257/723; 257/724
[58] Field of Search ...................... 437/183, 974, 437/984, 924, 944; 148/DIG. 135, 100; 156/631; 257/723, 724, 726

[56] References Cited

U.S. PATENT DOCUMENTS

| | | | |
|---|---|---|---|
| 3,959,045 | 5/1976 | Antypas | 148/DIG. 135 |
| 4,584,039 | 4/1986 | Shea | 156/637 |
| 4,604,160 | 8/1986 | Murakami et al. | 156/630 |
| 4,846,931 | 7/1989 | Gmitter et al. | 156/633 |
| 5,151,776 | 9/1992 | Wojnarowski et al. | 257/723 |
| 5,171,712 | 12/1992 | Wang et al. | 437/183 |
| 5,315,486 | 5/1994 | Fillion et al. | 257/723 |

FOREIGN PATENT DOCUMENTS 62-285432  11/1987  Japan .......................... 21/60

OTHER PUBLICATIONS

H. Choi et al., "Monolithic Integration of GaAs/AlGaAs LED and Si Driver Circuit," *IEEE Electron Device Lett.*, vol. 9, pp. 512–514, 1988.

M. G. Allen, et al., "Microfabricated Structures for the In Situ Measaurement of Residual Stress, Young's Modulus, and Ultimate Strain of Thin Films," *Applied Physics Letters*, vol. 51, No. 4, pp. 241–244, 1987.

I. Pollentier et al., "Fabrication of a GaAs–AlGaAs GRIN-SCH SQW Laser Diode on Silicon by Epitaxial Lift Off," *IEEE Photonics Technology Letters*, vol. 3, No. 2, pp. 115–117, 1991.

E. Yablonovitch et al., "Double Heterostructure GaAs/AlGaAs Thin Film Diode Lasers on Glass Substrates," *IEEE Photonics Technology Letters*, vol. 1, No. 2, pp. 41–42, 1989.

*Primary Examiner*—Sara W. Crane
*Assistant Examiner*—S. V. Clark
*Attorney, Agent, or Firm*—Hopkins & Thomas; Scott A. Horstemeyer

[57] ABSTRACT

Novel processes and apparatus permit lift-off, alignment, and bonding of materials and devices. The processes involve first depositing a device layer on a sacrifical layer situated on a growth substrate. A device may be defined in the device layer. The device layer or the device is coated with a carrier layer. The sacrificial layer and/or the growth substrate are then etched away to release the combination of the device layer and the carrier layer from the growth substrate. The device layer or device can then be aligned and selectively bonded to a host substrate. Other processes and apparatus are set forth for facilitating lift-off, bonding, handling, and patterning of he device layer or device.

9 Claims, 12 Drawing Sheets

PROCESSES AND APPARATUS FOR LIFT-OFF AND BONDING OF MATERIALS AND DEVICES

The U.S. Government has a paid-up license in this invention and the right in limited circumstances to require the patent owner to license others on reasonable terms as provided for by the terms of contract numbers ECS 90-58-144 E21-F37 awarded by the National Science Foundation. This is a continuation-in-part of application (s) Ser. No. 07/865,119 filed on Apr. 8, 1992, now U.S. Pat. No. 5,286,335.

FIELD OF THE INVENTION

The present invention generally relates to integrated circuit technologies, and more particularly, to a processes and apparatus for lift-off, alignment, and bonding (or (microscopic or macroscopic).

BACKGROUND OF THE INVENTION

The monolithic integration photonic and electronic materials and devices having gallium arsenide (GaAs) with host substrates, such as silicon (Si), glass, or polymers, will enable the fabrication of the next generation of integrated circuits, particularly, integrated circuit "cubes" having massive three dimensional communication networks and optoelectronic integrated circuits. A standard technique for GaAs-on-Si integration is heteroeptiaxial growth, which is described in H. Choi J. Mattia, G. Turner, and B. Y. Tsauer, "Monolithic Integration of GaAs/AlGaAs LED and Si Driver Circuit", IEEE Electron Dev. Lett., vol. 9, pp. 512–514, 1988, incorporated herein by reference. However, the crystal quality of this heteroepitaxial material is not optimum and is often inadequate for many optical applications.

An integration method which seeks to preserve the high material quality of lattice-matched growth is the epitaxial lift-off technique developed by Bell Communications Research, Inc., ("Bellcore"), as described in E. Yablonovitch, T. J. Gmitter, J. P. Harbison, and R. Bhat, "Double Heterostructure GaAs/AlGaAs Thin Film Diode Lasers on Glass Substrates", IEEE Phot. Tech. Lett., 1, pp. 41–42, 1989, incorporated herein by reference. Essentially, a thin aluminum arsenide (AlAs) sacrificial layer is grown on a GaAs growth substrate, and then GaAs/AlGaAs epitaxial layers are grown on top of the AlAs layer. The GaAs/AlGaAs lattice-matched epitaxial layers are separated from the growth substrate by selectively etching away the AlAs sacrificial layer. The GaAs/AlGaAs epitaxial layers can then be bonded in a hybrid fashion onto a wide variety of remote host substrates. In general, the epitaxial layers lifted off and bonded using the Bellcore technique are of high quality and are currently being used for the integration of GaAs/AlGaAs materials onto host substrates, such as Si, glass, lithium niobate, and polymers.

Although the Bellcore epitaxial lift-off technique yields integration of high quality epitaxial material, use of the technique is problematic. When using the Bellcore epitaxial lift-off technique, there is an inability to align and selectively bond the thin film epitaxial layers. Further, the Bellcore epitaxial lift-off technique is directed toward continuous films, not discrete devices. Finally, the technique requires systematic flexing of the carrier layer, which can undesirably damage the thin film epitaxial layers.

SUMMARY OF THE INVENTION

The present invention provides novel processes for monolithically integrating materials (thin or thick film) and devices (microscopic or macroscopic) using lift-off, alignment, and bonding (or grafting) processes.

The lift-off and grafting processes involve depositing a device layer on a sacrificial layer situated on a growth substrate. One or more devices, perhaps an array, may be defined in the device layer. The device layer or the device(s) is coated with a carrier layer. The sacrificial layer and/or the growth substrate are then etched away to release the combination of the device layer and the carrier layer from the growth substrate. The device layer or device can then be aligned and selectively bonded to a host substrate. Other processes and apparatus are set forth for facilitating lift-off, bonding, handling, and patterning of the device layer or device.

In accordance with a significant feature of the present invention, one or more perforations are placed in the carrier layer for facilitating the lift-off of the carrier layer and the device by enhancing etching of the sacrificial layer and for facilitating bonding of the device by permitting more easy alignment with a location on a host substrate.

In accordance with another feature of the present invention, a frame is disposed around the periphery of the carrier layer for providing support. This feature enables easy handling of the carrier layer with perhaps an array of devices.

In accordance with another feature of the present invention, a grid-like frame having openings is attached to or within the carrier layer for providing support. The devices are disposed within the openings of the grid-like frame. A periphery frame may also be desirable in combination with the grid-like frame.

Other features and advantages of the present invention will become apparent to one skilled in the art upon examination of the following drawings and the detailed description.

BRIEF DESCRIPTION OF THE DRAWINGS

The present invention, as defined in the claims, can be better understood with reference to the following drawings. The drawings are not necessarily to scale, emphasis instead being placed upon clearly illustrating principles of the present invention.

DETAILED DESCRIPTION OF THE PREFERRED EMBODIMENTS

FIGS. 1A through 1G illustrate a lift-off and bonding process 10 wherein a carrier layer is utilized to lift off and bond materials or devices. The process 10 can provide for lifting-off (a) thin film materials or devices having a thickness of typically between 1 and 20 micrometers, (b) thick film materials or devices, or (c) macroscopic integrated circuits or devices.

Figure 1A:
FIGS. 1A through 1G illustrate an lift-off and bonding process wherein a carrier layer is utilized to lift-off and protect the epitaxial layer.

With reference to FIG. 1A, a growth substrate 62 is provided with a sacrificial layer 64 and a device layer(s) 66. The sacrificial layer 64 and device layer 66 are grown on the growth substrate 62 using any conventional technique for semiconductor growth, such as molecular-beam epitaxy. The device layer 66 can be any material, including amorphous material, polycrystalline material, crystalline material (for example, an epitaxial material), or combinations of the foregoing materials. Furthermore, "deposit" or grammatical inflections thereof in the context of this document is to be construed in the broadest sense of the word to include any process for growing, forming, or bonding one material on another.

In the preferred embodiment, the growth substrate 62 is GaAs. The sacrificial layer 64 is a thin layer of aluminum gallium arsenide $Al_xGA_{1-x}As$, where $0.6 \leq x \leq 1.0$. Moreover, the device layer 66 comprises a GaAs-based compound. For example, the epitaxial layers 66 can comprise $In_xGa_{1-x}As_yP_{1-y}$ materials, where $0<x<1$ and $0<y<1$.

Mesa etch processing can then be used to define one or more devices 68 from the device layer 66. The mesa etch processing uses, for example, a photoresist mask and is performed using, for example, $H_2SO_4:H_2O_2:H_2O$ (1:8:160) as a fast gross etch with a final selective etch of $NH_4OH:H_2O_2$ (1:200) which stops at the AlAs sacrificial layer 64. For simplicity, the discussion hereafter refers only to the devices 68 and not to the single device layer 66, but it should be understood that the discussion is equally applicable to the single device layer 66 in an unpatterned state. Moreover, FIG. 1B shows several devices 68 to emphasize that, in general, the process 10 is performed on a mass scale to produce large pluralities of the devices 68 at a time. The devices 68 can be, for example, a transistor, diode configuration, communication device, compound semiconductor device, or any other desired device.

Other processing steps can occur relative to the devices 68 either before or after the mesa etch patterning. For instance, as shown in FIG. 1C, one or more material layers 72 can be deposited on the devices 68. The material layers 72 may comprise metals (for contacts, as an example), semiconductors, or dielectrics. Deposition of the material layers 72 can occur using any of numerous conventional techniques. In the preferred embodiment, material layers 72 are deposited on the devices 68 via vacuum deposition.

The devices 68 with layers 72 (as shown), if applicable, are coated with a carrier layer 74. In the preferred embodiment, the carrier layer 74 is a transparent polyimide, an organic material, or any other suitable material which can be made to act as a release layer. Apiezon W, which is essentially a black, opaque wax, can also be utilized as described in U.S. Pat. No. 4,846,931 to Gmitter et al. of Bellcore, the disclosure of which is incorporated herein by reference. Furthermore, it is also possible that the carrier layer 74 could be a metal, which has been evaporated, sputtered, and/or plated over the devices 68. However, use of a transparent polyimide is preferred for several reasons. Because of its transparency, devices 68 can be viewed while encapsulated and, therefore, selectively aligned as will be further discussed hereinafter. Moreover, polyimides exhibit the desirable mechanical property of being under residual tensile stress at room temperature. See Allen, M. G., Mehregany, M., Howe, R. T., and Senturia, S. D., "Microfabricated Structures for the In-Situ Measurement of Residual Stress, Young's Modulus, and Ultimate Strain of Thin Films," Applied Physics Letters, Volume 51, No. 4, pp. 241–244, 1987, incorporated herein by reference. Finally, the thermal properties of polyimides are excellent. Temperatures in excess of 400° C. can be maintained without damage to the polyimide or devices 68 protected thereby.

Figure 1E:
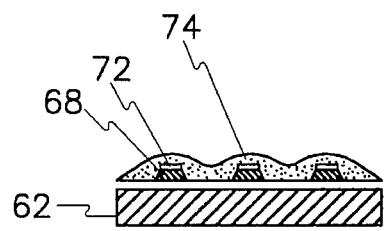
Figure 1B:
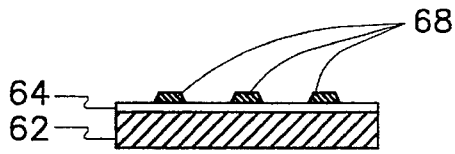

Next, as shown in FIG. 1E, the sacrificial layer 64 is etched away using any conventional etching technique that affords high selectivity between the sacrificial layer 64 and the devices 68. Preferably, a standard $HF:H_2O$ (1:10) etch solution is utilized in order to separate the combination of the devices 68 and the surrounding carrier layer 74 from the growth substrate 62, as shown in FIG. 1E. In accordance with a significant aspect of the present invention, metal layers (e.g., Al) or $Al_xGa_{1-x}As$ layers where $x<0.4$ can be included in the devices 68, because the devices 68 are protected on their sides from the etch solution $HF:H_2O$ (1:10) by the carrier layer 74. For a further discussion, see I. Pollentier, L. Buydens, P. Van Daele, P. Demeester, "Fabrication of GaAs—AlGaAs GRIN—SCH SQW Laser Diode on Silicon by Expitxial Lift-Off," IEEE Phot. Tech. Lett., 3, 2, pp. 115–117, 1991, the disclosure of which is incorporated herein by reference.

After the combination of the devices 68 and carrier layer 74 has been etched away, or lifted off, from the growth substrate 62, the combination can easily be handled, transported, and manipulated.

Figure 1F:
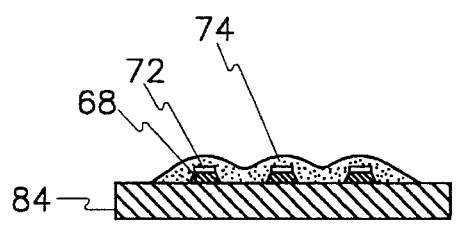
Figure 1C:
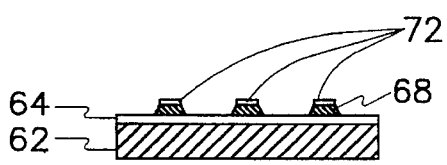

The devices 68 are placed over a host substrate 84, as shown in FIG. 1F. The devices 68 are placed in contact with or in close proximity to the host substrate 84. If the carrier layer 74 is a transparent polymer, alignment of the devices 68 with particular circuitry on the host substrate 84 is easily accomplished.

The devices 68 are bonded to the host substrate 84 by any of a variety of processes, including van der Waals bonding and/or metal-metal annealing. "Bonding" means affixing, adhering, or otherwise attaching one existing material or device to another.

After the devices 68 have been aligned and positioned over desired locations on top of the host substrate 84, the carrier layer 74 is dissociated from the devices 68. The dissociation can be effectuated using many techniques.

Figure 2:
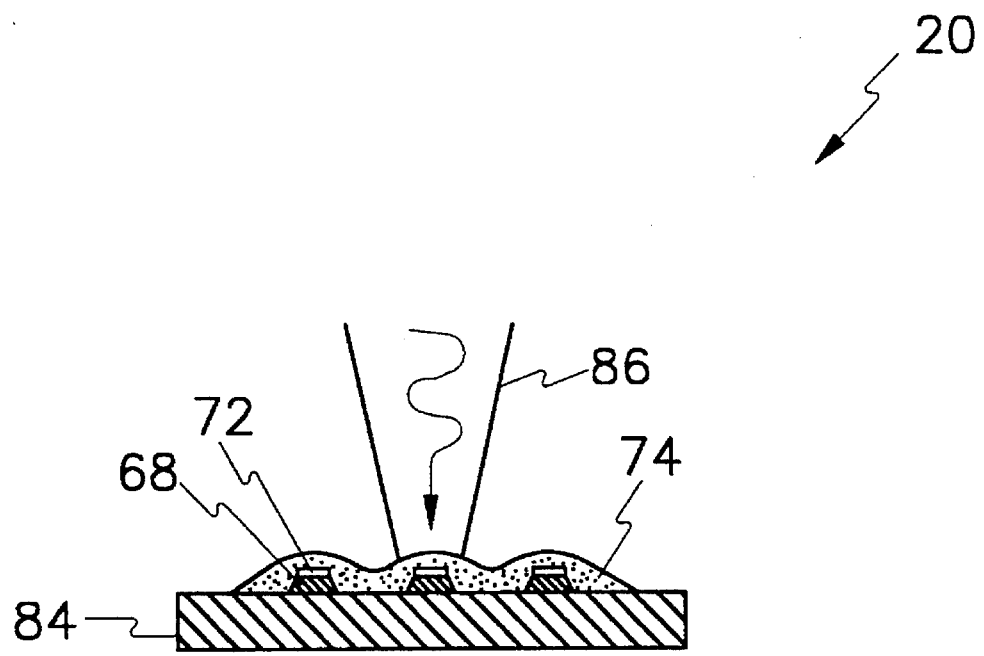
FIG. 2 illustrates a process for selective bonding of a single epitaxial device onto a host substrate without disturbance of the other epitaxial devices in the carrier layer.

For example, the bond between any of the individual devices 68 and the carrier layer 74 can be broken by the following well known processes: (1) thermally, for example, through spot heating or through local application of high-intensity laser light, (2) photolyrically through local exposure to short-wavelength laser light, (3) photochemically through local exposure to short-wavelength laser light in the presence of a reactive gas, or (4) chemically by etching or dissolution. As shown in FIG. 2, local activation of the bonding reaction by a confined application of heat or light enables selective bonding of a single device to a situs on the host substrate 84 without disturbing the remaining devices 68 in the carrier layer 74. A bonding head 86 exerts downward force on the carrier layer 74, thereby forcing one of the devices 68 into intimate contact with a bonding situs on the host substrate 84. Heat may be applied by conduction, or if the bonding head 86 is transparent, laser illumination can be used to activate the bonding. Thus, devices 68 which were grown close together can be bonded sparsely, enabling a small growth substrate 62 to provide sufficient devices 68 for a large host substrate 84. Alternatively, an entire array of devices 68 can be deposited, as will be described in further detail hereinafter relative to FIG. 4.

Figure 1G:
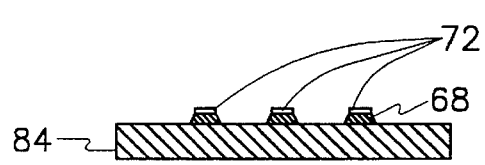
Figure 1D:
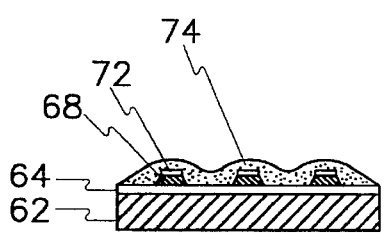

After dissociation, the devices 68 are in contact with the desired locations on the host substrate 84, as indicated in FIG. 1G. Preferably, the process shown in FIG. 1G is performed within a conventional clean room. Moreover, the host substrate 84 can comprise a Si or GaAs circuitry which has been developed and optimized independently of the devices 68. An oven-annealing step may be desirable at this point to further consolidate and strengthen the bonds between the devices 68 and the host substrate 84. Furthermore, a whole-wafer cleaning might also be carried out to remove any residual carrier layer material.

FIGS. 3A through 3G illustrate an alternative lift-off and bonding process 30 in accordance with the present invention. The alternative process 30 can also be utilized to lift off, align, and bond $In_xGa_{1-x}As_yO_{1-y}$ materials, where $0<x<1$ and $0<y<1$.

Figure 3A:
FIGS. 3A through 3G illustrate an alternative lift-off and bonding process.
Figure 3E:
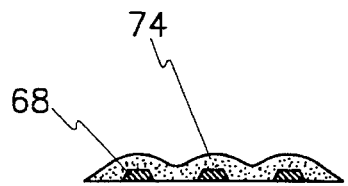
Figure 3B:
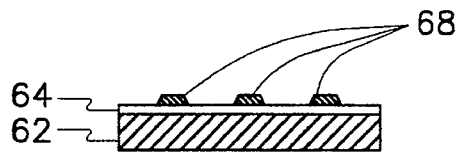
Figure 3F:
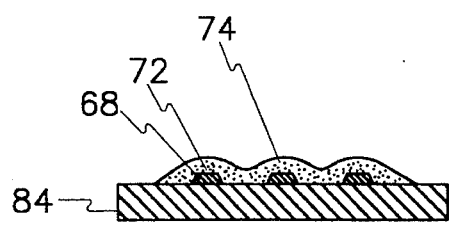
Figure 3C:
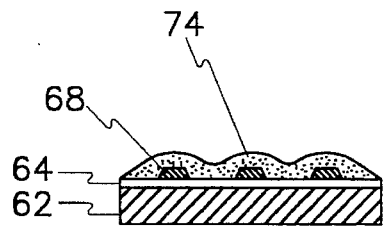

The steps of the process 30 shown in FIGS. 3A–3C are substantially similar to the steps shown and described with respect to FIGS. 1A–1D. Accordingly, the discussion set forth previously relative to FIGS. 1A–1D is incorporated herein by reference. However, in the process 30 of FIG. 3, the growth substrate 62 is preferably InP, the sacrificial layer 64 is preferably a $In_xGa_{1-x}As_yO_{1-y}$ material, where $0<x<1$ and $0<y<1$, and the device layer 66 is preferably a $In_xGa_{1-x}As_yP_{1-y}$ material, where $0<x<1$ and $0<y<1$.

Moreover, after the carrier layer 74 has been applied in order to encapsulate the devices 68 on the growth substrate 62, the InP growth substrate 62 is etched away, dissolved, or otherwise removed. In the preferred embodiment, a first etch solution can be, for example, $HCl:H_3PO_4$ (3:1). The first etch solution does not affect the InGaAsP sacrificial layer 64, as shown in FIG. 3E. Alternatively, a second etch solution, which can be, for example, $HF:H_2O_2:H_2O$ (1:1:10) or $H_2SO_4:H_2O_2:H_2O$ (1:1:1) in the preferred embodiment, can be applied to eliminate the InGaAsP sacrificial layer 64, as illustrated in FIG. 3E.

Figure 3G:
Figure 3D:
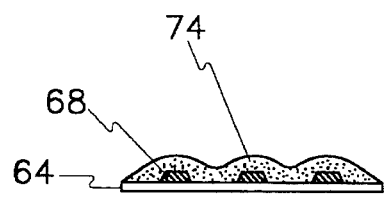

At this point, the devices 68 can be selectively aligned and positioned over desired locations of the host substrate 84, as illustrated in FIG. 3F. Finally, the devices 68 are bonded, as shown in FIG. 3G, onto the host substrate 84. The steps 3F and 3G can be preformed similarly to the respective steps described previously relative to corresponding FIGS. 1F and 1G. Accordingly, the discussion regarding FIGS. 1F and 1G is incorporated herein by reference.

PERFORATIONS IN CARRIER LAYER

Figure 4:
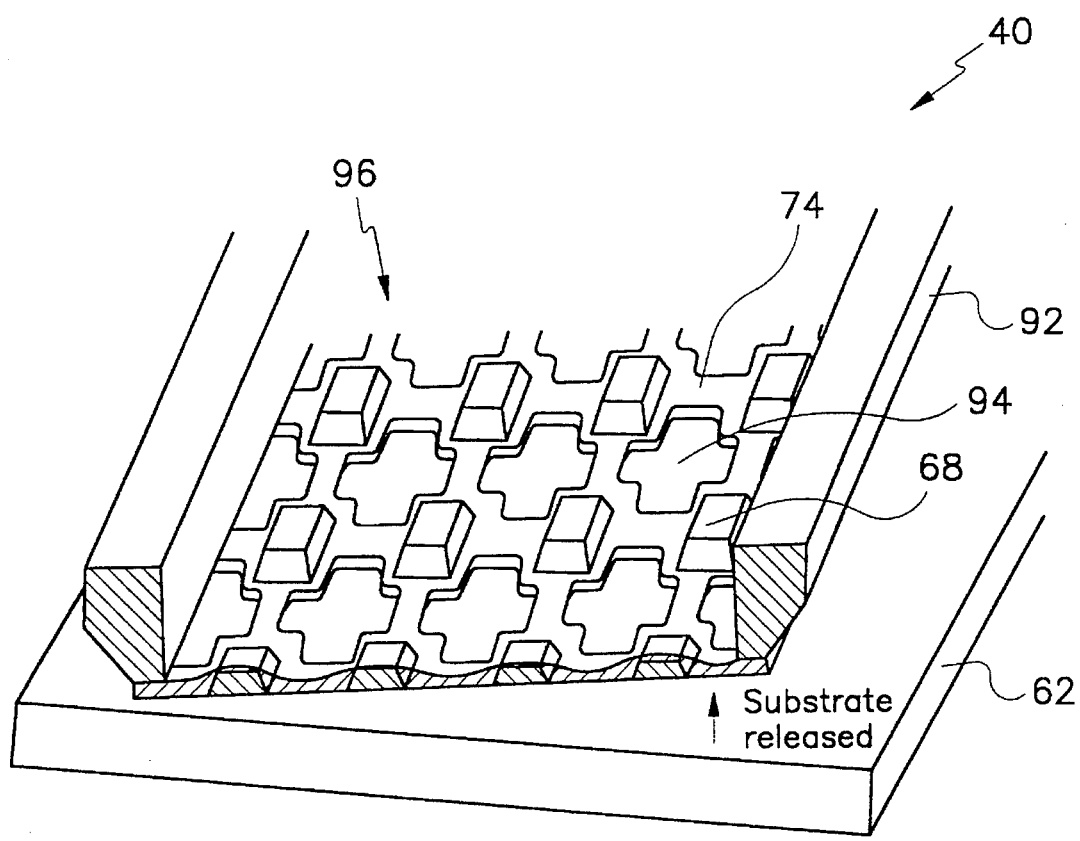
FIG. 4 is a perspective view with partial cross section of an array of devices suspended by a carrier layer having perforations and supported by a frame.

The lift-off and bonding processes 10, 30 can be facilitated by patterning the carrier layer 74 with perforations 94 uniformly across an array 96 of devices 68, as illustrated in FIG. 4. The perforations are created after the devices 68 have been encapsulated by the carrier layer 74. Standard patterning techniques are employed for introducing the perforations 94 across the carrier layer 74, which is generally polyimide in the preferred embodiments.

The perforations 94 essentially are throughways through the carrier layer 74 between and around the devices 68, as shown in FIG. 4. This predicament is desirable for at least the following reasons. Because the maximum distance any sacrificial layer etch must progress laterally during etching of the sacrificial layer 64 is less than the spacing between the devices 68, the time to release the devices 68 from the growth substrate 62 is much shorter, is constant, and is independent of the size of the array 96 of devices 68. The foregoing process therefore permits the lift-off and bonding processes 10, 30 to be scaled to arbitrarily large sizes of growth substrates 62. An additional advantage of this process is that the perforations 94 permit visual alignment through the carrier layer 74 when the devices 68 are bonded to the host substrate 84.

PERIPHERAL FRAME

A peripheral frame 92, as shown in FIG. 4, can be formed at the periphery of the carrier layer 74 for stabilizing the carrier layer 74, during the lift-off and bonding techniques 10, 30. The peripheral frame 92 is preferably formed before the devices 68 are freed or removed from the growth substrate 62. In fact, the peripheral frame 92 works well in combination with perforations 94. The peripheral frame 92 also helps in handling and aligning the devices 68 during bonding.

LIFT-OFF OF MACROSCOPIC INTEGRATED CIRCUITS

The lift-off and bonding processes 10, 30 can be applied to the manipulation of macroscopic pieces of semiconductor that contain multiple devices. The lift-off of mesas containing integrated circuits can be employed as an alternative to wafer thinning. Thicknesses for the microscopic pieces could range from a submicron through the tens of microns, perhaps to 50 microns or more. Diameters could range from the tens of microns to the hundreds of microns, and could approach or even exceed 1 mm.

The inventors further envision that the lift-off and bonding processes 10, 30 can be used as an alternative to conventional wafer thinning and dicing for the handling of thin, small chips of semiconductor material, such as are typically used in microwave and millimeter wave applications. In such applications, thinning of wafers is desirable so that a ground plane can be situated a small distance below the surface of the chip. This facilitates the realization of high-quality, controlled impedance conductor traces on the surface. A thinner chip permits conductor traces of a given characteristic impedance to have smaller lateral extent. Mechanical thinning, the current practice, now has a lower practical limit of approximately 50 microns and generally exhibits poor yield.

The lift-off and bonding processes 10, 30 facilitate the production of thinner chips with better yield. These thinner chips accept controlled impedance conductors with smaller lateral extent. Thus, a given microwave or millimeter wave circuit could be realized on a smaller chip. These thinner chips, with thicknesses ranging from perhaps 50 microns could also be integrated more easily into the next level of packaging because mechanical steps in the range of 5 to 50 microns can be compensated by existing planarization techniques employing spun-on polymers, glasses, or other dielectrics.

An additional benefit of thinner chips is that radio frequency (RF) shielding can be incorporated using planar fabrication techniques. For example, if a thin compound semiconductor chip were bonded to a silicon wafer, a thick dielectric layer could be deposited atop the bonded chip, for example, by means of plasma-enhanced CVD, followed by an evaporated or sputtered layer of metal. This would be a parallel process, and therefore, much more cost-effective than the building of individual metal "cans" above chips.

PROTRUSION OF DEVICES FROM CARRIER LAYER

Figure 5A:
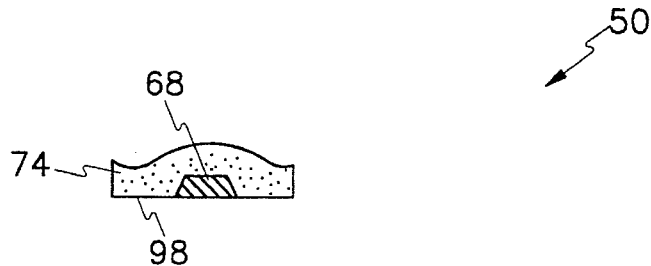
FIGS. 5A and 5B illustrate a first process for achieving protrusion of a device from the carrier layer.
Figure 5B:
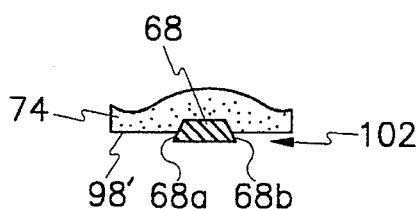

It is often desirable to cause the surface of a device 68 to protrude from the plane of the encapsulating carrier layer 74. At least two processes 50, 60 can be performed in order to accomplish this end. FIGS. 5A and 5B illustrate a first process 50. In the first process 50, the carrier layer 74 is utilized to lift-off a device 68, as shown in FIG. 5A. Next, the surface 98, which as adjacent to the sacrificial layer 64 prior to lift-off, is exposed to an unmasked, dry etch, for example, an oxygen plasma etch. The oxygen plasma does not damage the device 68, but in fact cleans the device 68 of organic residue while recessing the surface 98. In other words, as shown in FIG. 5B, the unmasked dry etching forms a new surface '98' with a protruding portion 102 of the device 68 extending therefrom.

Figure 6A:
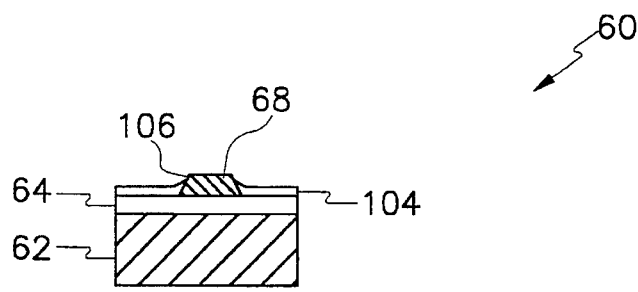
FIGS. 6A through 6C illustrate a second process for achieving protrusion of a device from the carrier layer.
Figure 6B:
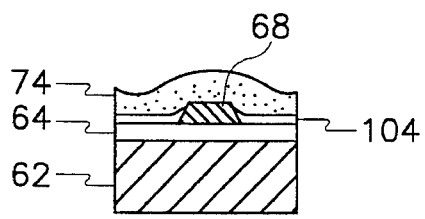
Figure 6C:
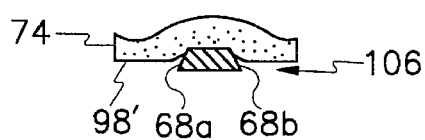

A second process 60 is shown in FIGS. 6A through 6C. In the second process 60, as shown in FIG. 6A, the sacrificial layer 64 is grown on the growth substrate 62, and the device 68 is formed on the sacrificial layer 64. This configuration is accomplished by way of the procedure utilized in the lift-off and bonding processes 10, 30. Specifically, the discussions relative to FIGS. 1A and 1B and FIGS. 3A and 3B are incorporated herein by reference. Next, a planarizing sacrificial layer 104, preferably a spin-on glass, is applied over the exposed surface of the sacrificial layer 64, while leaving a device portion 106 exposed, as shown in FIG. 6A.

As illustrated in FIG. 6B, the carrier layer 74 is then applied over the planarizing sacrificial layer 104 and the exposed device portion 106.

When the sacrificial layer 64 is etched away from the growth substrate 62 with a suitable etchant, such as hydrofluoric acid, the planarizing sacrificial layer 104 is also removed by the hydrochloric acid. Thus, the configuration illustrated in FIG. 6C is achieved, wherein the device 68 has a protruding portion 106 extending outwardly from the surface 98' of the carrier layer 74. A benefit of the process 60 illustrated in FIGS. 6A and 6B is that the planarizing sacrificial layer 104 provides a larger conduit for the etchant which eliminates the sacrificial layers 64, 104 so that the etchant proceeds very quickly.

Figure 7:
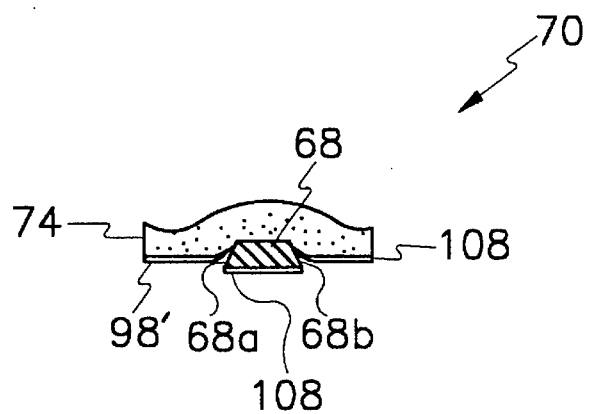
FIG. 7 illustrates a process for depositing a self-patterned metal layer onto a device protruding from the carrier layer.
Figure 8:
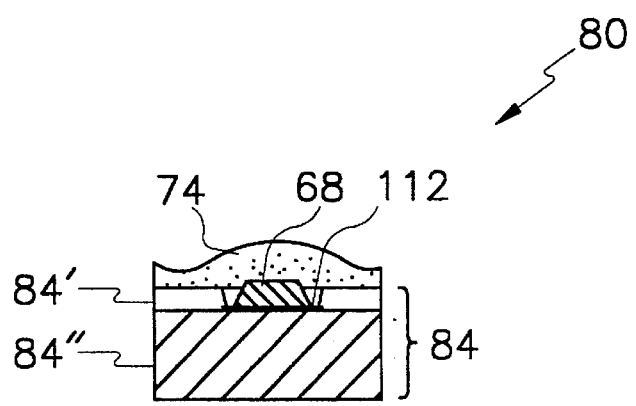
FIG. 8 illustrates a process for bonding a device protruding from the carrier layer onto a site on the host substrate.

The configurations illustrated in FIGS. 5B and 6C where the device 68 protrudes outwardly from the surface 98' have several advantages. First, because the side walls 68a, 68b of the device 68 are generally sloped (mesa) as a result of the etched process employed, the side walls 68a, 68b hang over the surface 98'. As a result, as shown in FIG. 7, a layer 108, such as a metal, can be applied to the surface 98'. The layer 108 is preferably applied with a collimated source (such as occurs in evaporation bonding processes). A natural break is produced in the layer 108 at the edges of the device 68. Second, the protruding devices 68 can be more easily bonded to recessed sites 112 on the host substrate 84, as is illustrated in FIG. 8. This scenario often arises when bonding to processed silicon wafers where the desired bonding layer lies below a final passivation layer 84', such as a dielectric, metal, combinations of the foregoing, or other passivating material.

BONDING IN AN INVERTED CONFIGURATION

Oftentimes, it is desirable to bond a lifted-off device 68 onto a host substrate 84 in an inverted configuration, such that its top side as grown is that which is bonded to the host substrate 84. One reason is that the underside of the device 68 which is exposed during lift-off is not easily patterned with conventional lithography because it is supported only by the thin, flexible carrier layer 74. In contrast, the top side of tile device 68 may be processed to an arbitrary degree while the device 68 still resides on the growth substrate 62. Once the device 68 is bonded in an inverted configuration, conventional lithographic processes are again suitable for processing the remaining exposed side. Thus, both sides of a device 68 may be patterned if the device 68 is inverted in the process.

Figure 9A:
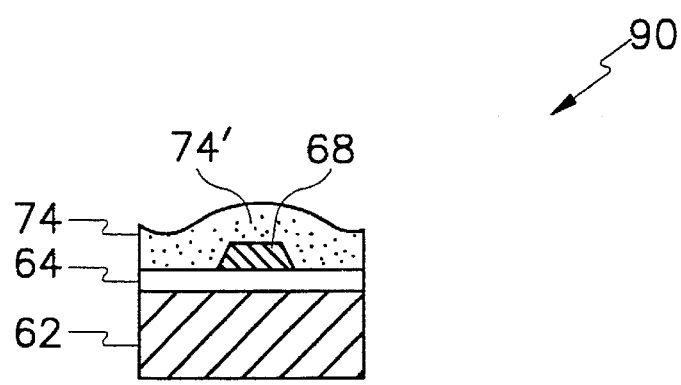
FIGS. 9A and 9B illustrate a process for exposing an encapsulated surface of the device while maintaining the integrity of the mechanical support afforded by the carrier layer.
Figure 9B:
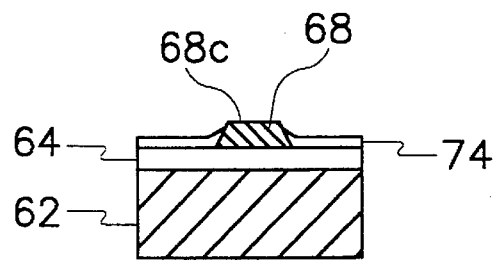

FIGS. 9A and 9B show a process 90 for bonding the device 68 in an inverted configuration. FIG. 9A shows the device 68 over the sacrificial layer 64 after the carrier layer 74 has been applied, in accordance with any of the foregoing processes 10, 30. The carrier layer 74 is preferably a spun-on polyimide which is substantially thinner directly above the device 68, as is designated by reference numeral 74'. An unmasked etch is then applied to the exposed top surface of the carrier layer 74 so that the thin region 74' over the device 68 is eliminated to expose the top side 68c of the device 68, as is shown in FIG. 9B. As part of the carrier layer 74 is depleted, enough material remains behind to provide a contiguous web of support for the device 68 or an array 96 of devices 68. Optionally, the top side 68c can now be processed for bonding. Furthermore, the device 68 can now be bonded topside down.

SELF-PATTERNING OF THIN FILMS ON DEVICE UNDERSIDE

A limited amount of patterning can be accomplished on the exposed surfaces of devices 68, while the devices 68 are supported by the carrier layer 74 by exploiting simple physical phenomena. FIGS. 10A through 10D show a process 1000 for depositing and then patterning one or more layers (for example, two layers 114, 116, as shown) on the protruding face of a device 68 which is supported by the carrier layer 74. The layers 114, 116 are patterned to cover only the central portion of the protruding face of the device 68. In other words, the layers 114, 116 can be patterned to have any desired periphery.

Figure 10A:
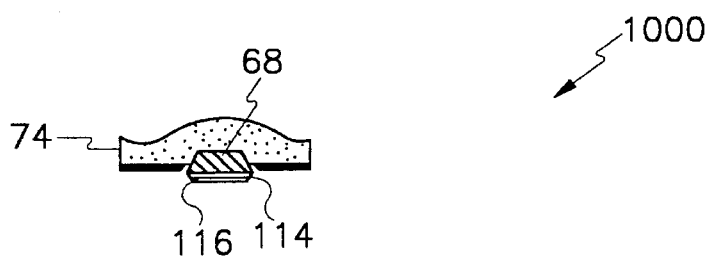
FIGS. 10A through 10D illustrate a process for self-patterning of photoresist on a device protruding from the carrier layer.

First, a device 68 having a protruding portion extending from the carrier layer 74 is acquired, using any of the processes 50, 60 described relative to FIGS. 5 and 6. FIG. 10A illustrates such a configuration wherein the device 68 comprises two outermost layers 114, 116, which may be deposited on the device 68 utilizing the process 70 described and shown relative to FIG. 7. However, it should be noted that the outermost layers 114, 116 can be layers which were grown adjacent to the sacrificial layer 64 prior to lift-off of the device 68.

Figure 10B:
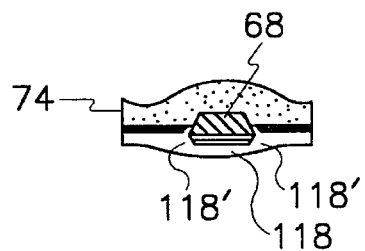

Next, as shown in FIG. 10B, a planarizing resist layer 118 is deposited, preferably by spray-coating, over the exposed portion of the device 68. Surface tension causes the planarizing resist layer 118 to pull into a smooth profile that results in a thinner portion 118' over the sharp periphery edges of the device 68.

Figure 10C:
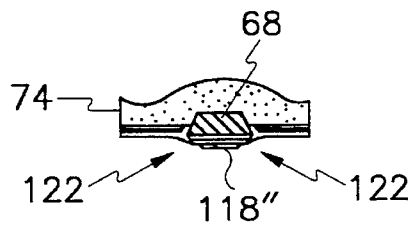

As illustrated in FIG. 10C, the planarizing resist layer is exposed to an etchant so that the resist layer 118 is patterned into a centralized body 118" within the periphery of the device 68. The centralizing body 118' is used as an etch mask over the layers 114, 116.

Figure 10D:
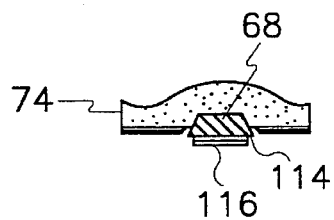

Accordingly, the layers 114,116 are etched around the periphery, as denoted by reference numeral 122, and then the etch mask 118" is removed with either the same etchant or another suitable etchant in order to form the configuration illustrated in FIG. 10D. Hence, the bottom of a device 68 is patterned to some degree before bonding the device 68 onto the host substrate 84.

It should be noted that the foregoing process 1000 can be slightly modified. In this regard, the planarizing resist layer 118 can be in the form of a material that can be caused to melt and flow under the influence of surface tension, such as a low-melting temperature glass. Such materials can be deposited readily onto a free-standing membrane and can be easier to employ in this technique than the planarizing resist layer 118 or other materials applied in a liquid phase.

CO-PROCESSED INTEGRATED MIRROR AND ELECTRICAL CONTACT

It is often desirable in vertical electro-optical devices, for example, light emitting diodes (LEDs), multiple quantum well (MQW) modulators, vertical cavity lasers, and vertical photodetectors, to incorporate both an electrical contact and a high quality optical mirror at the same end of the device. An electrical contact, although it embodies a metal layer, makes a poor internal reflector because of reactions between metal and semiconductor that render the interface optically rough and highly absorbing. Accordingly, it is beneficial to interpose a mirror layer that is inert with respect to the device between the device and the metal layer which serves as the electrical contact.

Figure 11:
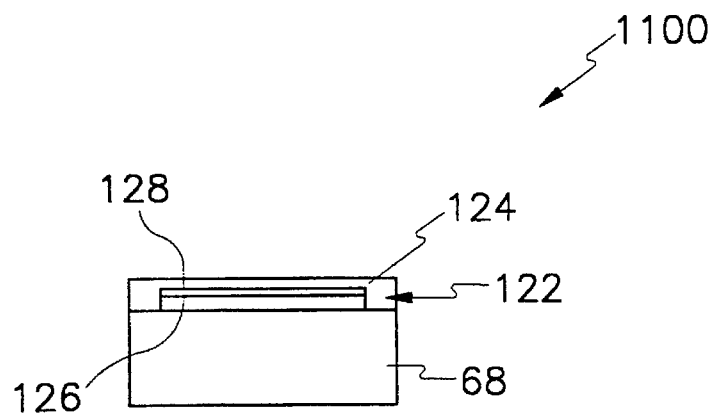
FIG. 11 illustrates a device having a mirror surrounded by a peripheral electrical contact, which structure is disposed on the device either before or after lift-off or after placement of the device on the host substrate.

FIG. 11 shows an embodiment 1100 wherein a device 68 has an integrated high quality mirror 122 and an electrical contact 124 at an end of the device 68. The mirror 122 can be any suitable reflector material and can comprise any number of layers. In the preferred embodiment, the mirror 122 comprises a thin silicon dioxide ($SiO_2$) layer 126 deposited atop the device 68 in combination with a high-quality reflector layer 128, for example, a metal <such as chrome), a passive dielectric stack (a stack of alternating layers of low and high index dielectric materials, one of which could also be $SiO_2$), or another suitable material. It should further noted that if a passive dielectric stack is utilized, the stack can be capped by a layer that acts as a high quality mirror and/or barrier to reaction with layers to follow.

The mirror 122 and the electrical contact 124 can be disposed on the device 68, as shown in FIG. 11, before lift-off or after lift-off of the device 68 from the growth substrate 62. If the mirror 122 and the electrical contact 124 are disposed on the device 68 prior to lift-off using the carrier layer 74, then conventional lithography can be employed to pattern the layers 122,124 so that any desired periphery is established. It is preferred that only the mirror 122 and electrical contact 124 be centralized on the device 68. If the mirror 122 and the electrical contact 124 are disposed on the device 68 after lift-off of the device 68 from the growth substrate 62, then the previously mentioned self-patterning technique described relative to FIGS. 7 and 10 may be employed. Finally, it should be noted that the electrical contact 124 is applied over the entire face of the device 68, covering and encapsulating the mirror 122, and contacting the device 68 on the periphery thereof. Thus, there is an electrical interconnection between the electrical contact 124 and the device 68 along the periphery of the electrical contact 124, and a high quality mirror 122.

Figure 12:
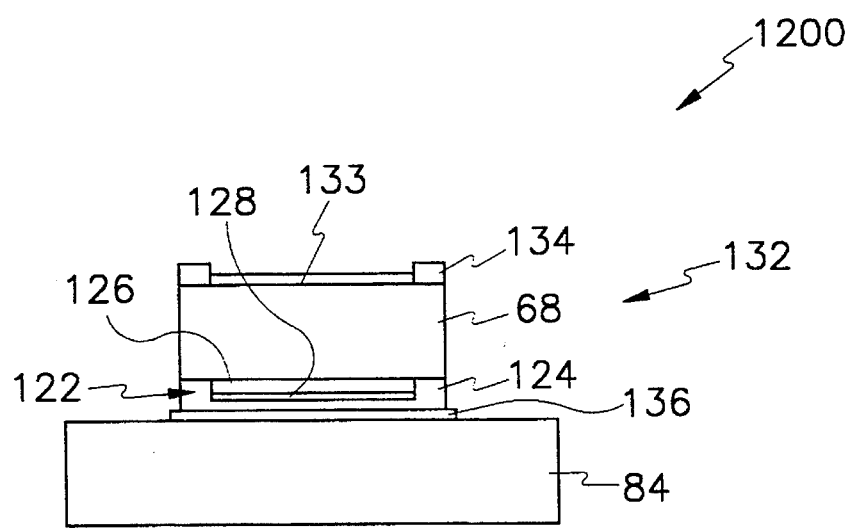
FIG. 12 illustrates a vertical electro-optical device with top and bottom mirrors and respective top and bottom electrical contacts.

FIG. 12 shows an embodiment 1200 of a vertical electro-optical device 132 situated on the host substrate 84. The vertical electro-optical device 132 comprises a bottom and top mirrors 122, 133 and bottom and top electrical contacts 124, 134. Further, FIG. 12 shows a metal layer 136 disposed on the host substrate 84 for facilitating bonding and bonding between the vertical electro-optical device 132 and the host substrate 84. The bottom mirror 122 and the bottom electrical contact 124 can be formed as described above relative to FIG. 11. Moreover, the top mirror 133 and the top electrical contact 134 can be formed prior to lift-off, after bonding of the device 68 onto the host substrate 84, or after lift-off and prior to bonding. In the latter scenario, the periphery of the top mirror 133 can be patterned in accordance with the discussion relative to FIG. 10, and then the electrical contact 134 is applied by depositing a metal layer in accordance with the discussion relative to FIG. 7 while the mask 118" remains. After the metal is applied to thereby create the electrical contact 134, then the mask 118" is etched away, thereby leaving the electrical contact 134 in tile form of periphery ring, as shown in FIG. 12.

VACUUM BAG PROCESS FOR ARRAY BONDING

It is often desirable to bond the arrays 96 of devices 68, as illustrated in FIG. 4, simultaneously to host substrates 84. This process requires the uniform application of heat and/or pressure to the devices 68 in contact with bonding sites on the host substrate 84, if eutectic bonding is to be contemplated as a bonding technique. Clamping the carrier layer 74 and the host substrate 84 between two flat rigid surfaces is an obvious approach which is problematic when large arrays are utilized and imposes stringent requirements of thickness uniformity on the carrier layer 74 and the host substrate 84.

Figure 13:
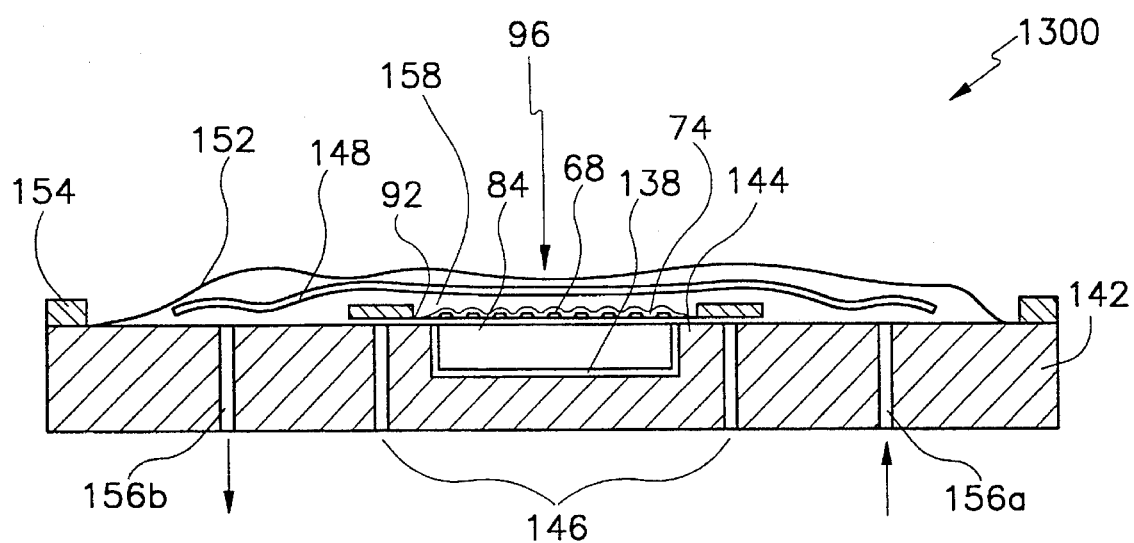
FIG. 13 illustrates a process configuration and associated apparatus for vacuum-assisted array bonding.

In accordance with the present invention, a process permits uniform application of heat and pressure in an oxygen-free ambient to the array 96 of devices 68 in contact with the host substrate 84, as is illustrated in FIG. 13. The host substrate 84 is placed in a recess 138 within a hot plate 142, such that an approximately planar surface 134 along the hot plate 142 is obtained. The array 96 of devices 68, preferably carried on the frame 92, is aligned with an array of bonding sites on the host substrate 84 and is placed in contact with or in close proximity with the bonding site. Preferably, the array 96 with frame 92 is fixed in place on the host substrate 84 by vacuum ports 146 in the hot plate 142 which pull the frame 92 against the surface 144.

The array 96 and frame 92 are covered by a porous layer 148, such as a sponge or other suitable material, which is permeable to the flow of gas. The porous layer 148 is covered by flexible, gas-tight membrane 152 which is sealed at its edges to the hot plate surface 144, preferably by an outer periphery frame 154. The membrane 152 may be a thin metal, polyimide, or another suitable material.

Gas ports 156a, 156b passing through the hot plate 142 emit either an inert gas (such as nitrogen) or a reducing gas formulation (such as a hydrogen-nitrogen mixture) within the internal region 158 defined by the membrane 152 and the hot plate surface 144. As indicated by reference arrows in FIG. 13, gas is preferably introduced into the port 156a and is output through the port 156b. The ports 156a, 156b can be used to facilitate bonding by purging oxygen from the reaction environment via flowing process gas through the ports 156a, 156b.

Compressive pressure is applied to the carrier layer 74 against the host substrate 84 by reducing the inflow of process gas through the port 156a while continuing to remove process gas through the output port 156b. This predicament creates a vacuum within the internal region 158 under the membrane 152. The uniformity of this pressure is excellent and is independent of small variations in thickness of the host substrate 84 and the carrier layer 74. Once the reaction environment is free of oxygen and sufficient pressure is applied, the hot plate 142 is heated to an appropriate temperature for eutectic bonding. After the appropriate temperature has been achieved and after the devices 68 have been eutectically bonded to sites on the host substrate 84, the host substrate 84 with the bonded array of devices 68 can be removed from the hot plate 142. The devices 68 may be released from the carrier layer 74 via etching in an oxygen plasma or by other suitable means as described previously in this document.

COMPOSITE SUPPORT STRUCTURE FOR CARRIER LAYER FOR IMPROVED STRENGTH AND THERMAL EXPANSION CONTROL

When bonding arrays 96 of devices 68, such as shown in FIG. 4, it is important that the carrier layer 74 remain dimensionally stable so that precise global registration of the devices 68 with bonding sites on the host substrate 84 is assured. This accomplishment is aided by the presence of the rigid periphery frame 92 (FIG. 4) which supports the carrier layer 74 at its periphery, but the rigid periphery frame 92 cannot guarantee that deformations will not occur at the interior region of carrier layer 74 as the carrier layer 74 is increased in area. Thus, a means of strengthening the carrier layer 74 within the interior region of the periphery frame 92 is desirable. Furthermore, any heating associated with the bonding processes 10, 30 may cause misalignment or damage indirectly to the carrier layer 74 by way of differential thermal expansion of the carrier layer 74 and the host substrate 84.

Figure 14A:
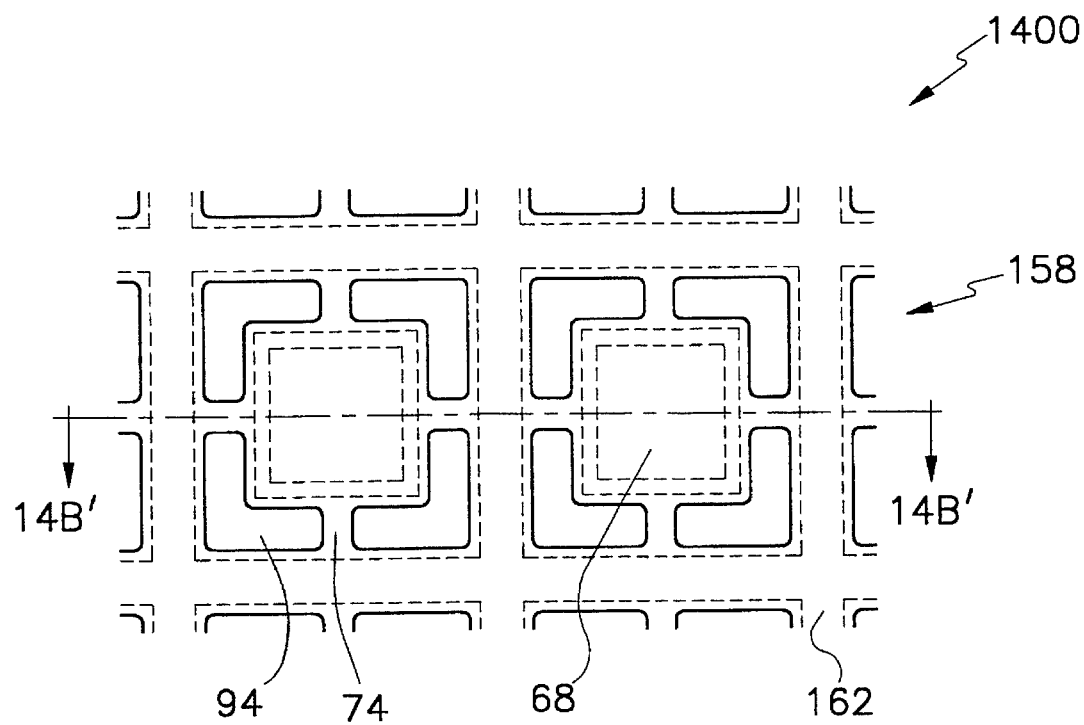
FIGS. 14A and 14B illustrate a composite support structure for the carrier layer which exhibits improved strength and thermal expansion control.
Figure 14B:
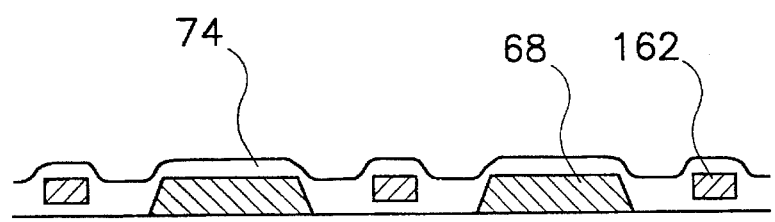

In accordance with the present invention, as shown in FIGS. 14A and 14B, a grid-like composite support structure 158 is utilized for strengthening, stiffening, and/or adding rigidity to the carrier layer 74 as well as for facilitating the engineering of the carrier layer's coefficient of thermal expansion to match that of the host substrate 84. The composite support structure 158 comprises a web of structural material 162 encapsulated within the carrier layer 74. The structural material 162 may comprise a metal, which can be deposited using a combination of vacuum deposition with lithography and plating techniques, or by other means, nonmetallic materials, such as polysilicon, or any other suitable material for providing support characteristics.

The composite support structure 158 is fabricated by augmenting the carrier layer 74 with the structural material 162, which is then encapsulated by a further deposition and/or patterning of the carrier layer material. The coefficient of thermal expansion of the composite support structure 158 can be engineered by judicious choice of materials for the structural material 162 and the carrier layer 74 and by appropriate structural design of the carrier layer cross-section, as is illustrated in FIG. 14B.

HYDROSTATICALLY-BOWED SUPPORT STRUCTURE FOR BONDING OF LARGE AREA DEVICE LAYERS

It is often desirable to bond large area (perhaps continuous) semiconductor films. In the foregoing instances, perforations 94 (FIG. 4) in the carrier layer 74 are impractical and the etch of the sacrificial layer 64 for providing lift-off may require an unacceptably long time period. Further, the manipulation of the large area films for bonding is problematic.

Figure 15A:
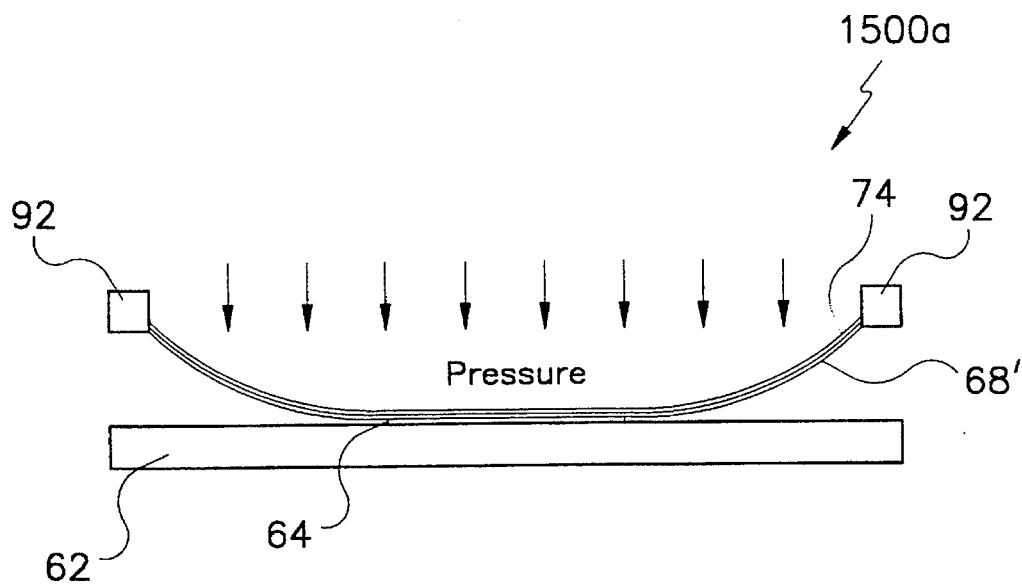
FIGS. 15A and 15B illustrate a process configuration and associated apparatus for hydrostatically bowing the combination of the carrier layer and a semiconductor layer(s) for improved lift-off and bonding, respectively.

FIG. 15A illustrates a process 1500a for hastening and controlling the lift-off etch for a large area device layer 68' during the lift-off process. The process 1500a entails the application of a hydrostatic pressure against the carrier layer 74 during lift-off of the carrier layer 74 when the sacrificial layer 64 is etched away. The carrier layer 74 is preferably supported by a periphery frame 92. Reference arrows are shown for indicating application of force against the carrier layer 74 by hydrostatic pressure. The pressure differential causes the carrier layer 74 and the device layer 68' to bow outwardly into a convex shape. The pressure differential may be created by any suitable means. Preferably, the pressure differential is supplied by disposing a column of liquid against the carrier layer 74 or by applying regulated gas pressure against the carrier layer 74. During the lift-off process 1500a as shown in FIG. 15A, the convex shape of the carrier layer 74 and the device layer 68' helps to expose the etching frontier more effectively to the etchant, which in effect accelerates the pace of the etching process.

Figure 15B:
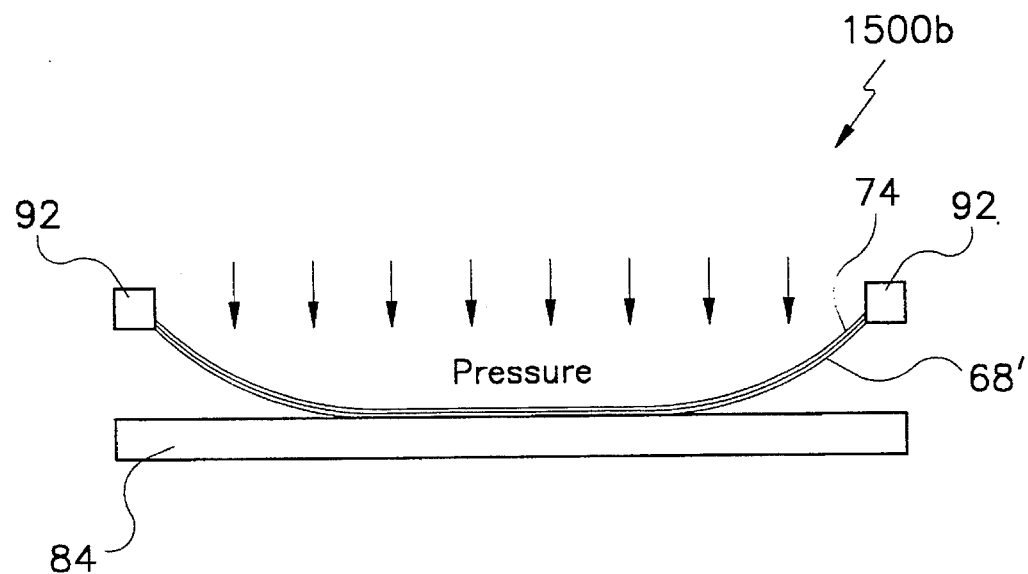

FIG. 15B illustrates a process 1500b for bonding the large area device layer 68' to the host substrate 84 in a controllable and continuous manner. The process 1500b entails the application of hydrostatic pressure against the carrier layer 74, preferably supported by the periphery frame 92, when the carrier layer 74 is brought into contact with the host substrate 84. Reference arrows indicate application of force against the carrier layer 74 by hydrostatic pressure. The pressure differential causes the carrier layer 74 and the device layer 68' to bow outwardly into a convex shape. During the bonding process 1500b as shown in FIG. 15B, the convex shape of the carrier layer 74 and the device layer 68' causes the central region of the device layer 68 to make initial contact with the host substrate 84 when van der Waals bonding is employed. Also, during bonding, bubbles and wrinkles are eliminated which can adversely affect the yield of the bonded device layer 68'. Just as with the process 1500*a* of FIG. 15A, the pressure differential in the process 1500*b* of FIG. 15B may be created by any suitable means, as described.

Those persons skilled in the art will readily appreciate that many modifications to the embodiments described above are possible without materially departing from the novel teachings of the present invention. Accordingly, all such modifications are intended to be included within the scope of the present invention, as set forth in the following claims.

Wherefore, the following inventions are claimed:

1. In a carrier layer for lift-off of an array of devices, the carrier layer formed on the array, the array formed on a sacrificial layer, the sacrificial layer formed on a growth substrate, an improvement for facilitating the lift-off of the carrier layer and the array by enhancing etching of the sacrificial layer and for facilitating bonding of the array by permitting more easy alignment with locations on a host substrate, the improvement comprising perforations within said carrier layer situated about the devices of the array.

2. The improvement of claim 1, further comprising a frame around a periphery of said carrier layer.

3. The improvement of claim 1, further comprising a grid-like frame having openings attached to said carrier layer and wherein said devices are disposed within said openings.

4. The improvement of claim 1, wherein said carrier layer comprises a polyimide.

5. The improvement of claim 1 further comprising a frame around a periphery of said carrier layer and touching said carrier layer.

6. The improvement of claim 3, wherein said frame is touching said carrier layer.

7. The improvement of claim 3, wherein said frame is encapsulated within said carrier layer.

8. An apparatus for lift-off and bonding of devices deposited on a growth substrate said growth substrate having opposing first and second surfaces, comprising:

a sacrificial layer deposited on said first surface of said growth substrate, said sacrificial layer having an exposed surface opposite to said growth substrate:

said devices to be lifted off situated on said exposed surface of said sacrificial layer;

a carrier layer coating said devices and a portion of said exposed sacrificial layer not covered by said devices; and said carrier layer having perforations.

9. The apparatus of claim 8, further comprising a grid-like frame having openings and attached to said carrier layer and wherein said carrier devices are disposed within said openings.

* * * * *

UNITED STATES PATENT AND TRADEMARK OFFICE
CERTIFICATE OF CORRECTION

PATENT NO. : 5,465,009

DATED : November 7, 1995

INVENTOR(S) : Drabik et al

Page 1 of 2

It is certified that error appears in the above-indentified patent and that said Letters Patent is hereby corrected as shown below:

In the Abstract, line 12, delete "he" and insert --the--;

In column 1, line 10, delete "application(s)" and insert --application--;

In column 1, line 18, after "(or" insert --grafting) of materials (thin or thick film) and devices--;

In column 3, line 54, delete "$In_xGa_{1-x}As_yP_{1-y}$" and insert --$In_xGa_{1-x}As_yP_{1-y}$--;

In column 7, line 44, delete "'98'" and insert --98'--;

UNITED STATES PATENT AND TRADEMARK OFFICE
CERTIFICATE OF CORRECTION

PATENT NO. : 5,465,009
DATED : November 7, 1995
INVENTOR(S) : Drabik et al

It is certified that error appears in the above-indentified patent and that said Letters Patent is hereby corrected as shown below:

In column 9, line 64, delete "<such" and insert --(such--;

In column 10, line 44, delete "tile" and insert --the--;

In column 14, line 10, delete "substrate said" and insert --substrate, said--; and In column 14, line 23, delete "layer and" and insert --layer, and--.

Signed and Sealed this

Fifth Day of March, 1996

Attest:

BRUCE LEHMAN

Attesting Officer  Commissioner of Patents and Trademarks